United States Patent [19]

Ollington et al.

[11] 4,066,875
[45] Jan. 3, 1978

[54] HIGH SPEED PULSE COUNTER

[76] Inventors: David R. Ollington, 9 Woodland Way, Caterham; Ishver L. Zala, 129 Fleetside, West Molesey, both of England

[21] Appl. No.: 724,374

[22] Filed: Sept. 17, 1976

[30] Foreign Application Priority Data

Sept. 7, 1976 United Kingdom ............... 37082/76

[51] Int. Cl.² ........................................... H03K 21/34
[52] U.S. Cl. ........................ 235/92 TF; 235/92 DM; 235/92 R
[58] Field of Search ....... 235/92 TF, 92 FQ, 92 DM; 324/160, 181, 186

[56] References Cited

U.S. PATENT DOCUMENTS

| | | | |
|---|---|---|---|
| 3,525,044 | 8/1970 | Richmond | 235/92 FQ |
| 3,917,927 | 11/1975 | Minton | 235/92 TF |
| 3,949,199 | 4/1976 | Odom | 235/92 DM |

*Primary Examiner*—Joseph M. Thesz
*Attorney, Agent, or Firm*—Karl W. Flocks

[57] ABSTRACT

A high speed pulse counter suitable for mega-frequency pulse counting is disclosed with provision for autoranging between different gating time generators by means of a gating time selector actuated by an overflow pulse generated by the input pulse succeeding the display of a full register. A circuit divider provides for prescaling of the input signal applied to the register. The operation of the circuit divider is controlled by means for automatically controlling the divider circuit.

3 Claims, 5 Drawing Figures

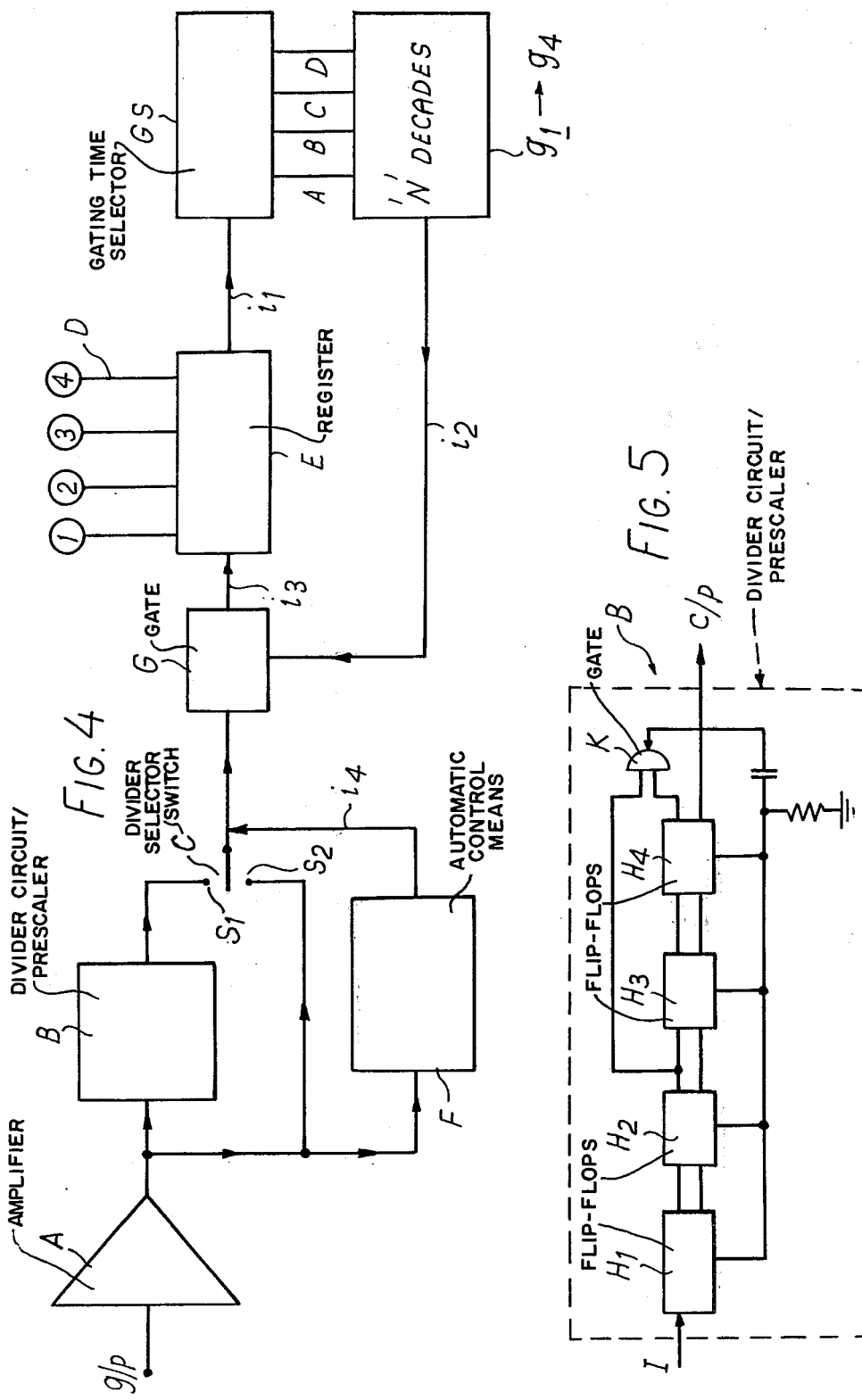

HIGH SPEED PULSE COUNTER

FIELD OF THE INVENTION

This invention relates to a high speed pulse counter more especially an auto-ranging counter.

BACKGROUND TO THE INVENTION

Pulse counters are known which have the capacity to handle input signals with pulses in the megahertz frequency range. Conventionally such high speed pulse counters depend on the selection of a gating time related to the frequency of pulses being counted; the gating time being the time interval during which pulses are totalised. In practice hitherto the gating time has been selected either manually on the basis of the operative knowing the probable range or automatically through the use of an overflow pulse.

The use of an overflow pulse leads to the designation of a high speed counter as an auto-ranging counter and the present invention is concerned with an improvement to such auto-ranging counters.

Another technique employed with high speed counters is to employ a divider circuit to mathematically divide the input signal to be counted. In other words, assuming a regular frequency for the input signal over the input or measuring interval, a decade division of the input signal is accomplished by passing the input signal to the counter via a divider circuit. Such a circuit is only employer at input signal frequencies such that for the gating times available to the counter, are practicable for the sub-divided frequency of the high speed pulses. Normally the divider circuit has decade steps and is manually actuated by the operator working down from the highest range of possible frequency ranges.

SUMMARY OF THE INVENTION

The present invention seeks to provide a pulse counter in which the use of a gating time selector and a circuit divider is used to optimum effect.

According to the present invention there is provided a high speed pulse counter comprising a gating time selector arranged to be triggered by an overflow pulse generated by the input pulse succeeding the input pulse which causes the counter display register to indicate a full register within the period of a currently operative gating time thereby to advance the gating time selector to the next gating time, at least one divider circuit adapted to sub-divide an input signal of high speed pulses to be counted and arrange for only a predetermined ratio of said input pulses to be counted and displayed by the counter register, and means for automatically actuating the divided circuit.

DESCRIPTION OF THE DRAWINGS

Reference will now be made by way of explanation to the accompanying drawings for the purpose of more clearly describing the invention and embodiments thereof. In the drawings, FIG. 1. illustrates schematically a high speed pulse counter having an automatic provison for actuation of a gating time selector by an overflow pulse technique;

FIG. 4. illustrates schematically a counter similar to FIG. 3; and,

FIG. 5. illustrates schematically the divider circuit of FIG. 4.

DETAILED DESCRIPTION OF EMBODIMENTS

Figure 1:
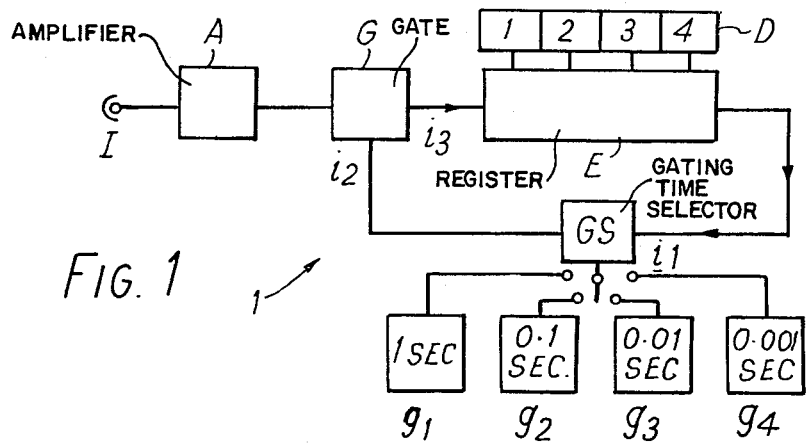

The FIG. 1. high speed pulse counter 1 has a four decade digital display D associated with its register E. In consequence 9999 is the maximum count possible during a given gating time, viz the period or time interval during which pulses are totalised. Thus, if the digital display D is to represent a numerical value directly proportional to the pulse rate of the input signal to be counted, the number of pulses received by the register E during the operative gating time must be less than the register capacity M, in this case 9999. Since a single counter 1, with a given number of decades $n$ in its register E and display D, has a given counting range $n$ decades for a particular gating time, the counting range R (equal to a multiple of M) is extended by having a plurality $r$ of gating times. In a decade arrangement the range R equals the product $M.10^r$ It was known to provide a manual selector such that the gate G was triggered or pulsed at the beginning and end of the gating time by a particular one of a plurality of gating time generators $g_1$ to $g_4$ This manual selector comprised a rotary contact switch (not shown) which an operator stepped downwardly. This assumed the highest value of pulses to be counted (within the range of the counter) and the selector was manually stepped from the longest gating time generator $g_1$ through the lower gating time generators $g_2 \ldots g_4$ until the situation occured that the display D did not display its maximum count M (i.e., a full register) but a lesser value. The counter 1 of FIG. 1. achieves gating time selection automatically. The gating time selector GS is such as to make rotary steps between the four gating time generators, $g_1$ to $g_4$ : the rotary switching is shown schematically. These rotary steps are initiated by the receipt of an overflow pulse from the counter register E on the gating time selector input $ii$. Thus, an overflow pulse on the input $i_1$ causes the gating time selector GS to step anti-clockwise from $g_1$ to $g_2$ and so on in sequence. Reset occurs before a further separate count is made.

The overflow pulse technique may be illustrated by numerical example. Consider a counter with a four decade display register. Suppose that the input signal, that is the pulses to be counted, has a frequency (pulses/sec) of 0.9 MHz and that initially the counter is operating with a gating time of 1 second. Once 9999 pulses have been registered the display register is full within the gating time of 1 second. An overflow pulse is then generated as soon as the next pulse is received. This overflow pulse is effective to switch the gating time selector to select the next gating time available which is 0.1 second: the gating times being stepped in decade steps, usually in mechanical terms by the stepping of a rotary contact switch. Once again 9999 pulses are counted and the display register is full within the gating time now 0.1 second. Once again an overflow pulse is generated and on this occasion a gating time of 0.01 second is selected by the stepping of the gating time selector. With this gating time, 9000 pulses are counted in an interval of 0.01 second and the count is displayed. Since there is no "overflow pulse" because the value of 9999 is not reached within the period of the gating time, there is no further stepping of the gating time selector.

In the circuit of FIG. 1. the input I is amplified by amplifier A which precedes gate G in order that the pulses attain the requisite pulse height for the counter E.

Gate G receives the input I after amplification or shaping at amplifier A, and the gate G is triggered at the beginning and end of a gating time period by the signal or input $i_2$ from the gating time selector GS. The input $i_3$ to the counter register E is the pulse flow obtained from input signal I whilst the gate G is operative during the period determined by signal $i_2$ The periods $g_1$ to $g_4$ of 1 second to 0.001 second in decade steps are the preferred range of gating times but other series may be adopted.

Figure 2:
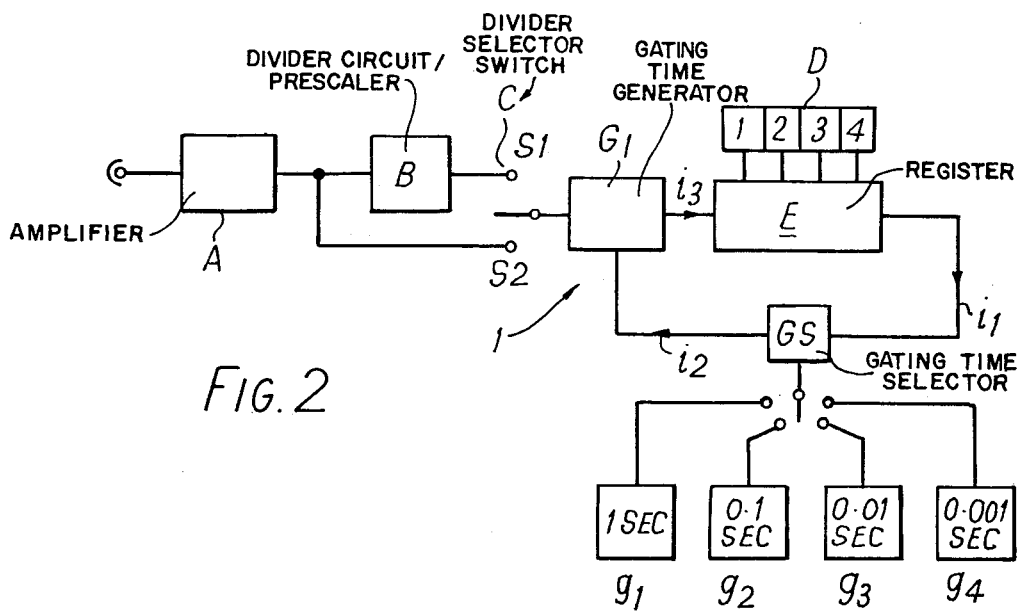
FIG. 2. illustrates schematically the counter of FIG. 1 which has the addition of a divider circuit under manual control.

In FIG. 2, the high speed counter of FIG. 1, is modified by the provision of the divider circuit B and a manually operable switch C. As shown, the switch C has two positions S1 and S2. For the S1 position of switch C the divided circuit B is operative. This particular divider circuit is a decade divider which is arithmetically convenient. With the switch C in the S2 position, the counter of FIG. 2 operates in the same manner as the counter of FIG. 1, the input signal by-passing the divider circuit C and passing directly from the amplifier A to gate G.

The circuit divider C is brought manually into operation at the highest frequency counting capability of the counter 1, by the operator switching switch C to position S1. In the context of the above description of operation of the counter of FIG. 1, it was mentioned that with the gating time generator $g_4$ operative a gating time of 0.001 second is effective. Assuming that the input signal has a frequency exceeding 9.999 MHz, then the register and display of the counter 1 of FIG. 1 fall within the gating time of generator $g_4$. Consequently, the counter of FIG. 1 cannot indicate at its display D a value proportional to the input signal I, but merely indicates a full register. At this point, the operator may manually place switch C in position S1 and obtain a read out on the display proportional to the actual input frequency — assuming the input frequency is less than 100 MHz. For the higher frequencies additional divider circuits may be added.

It is important to note that the display only gives four figures if it is a four decade display. Further, if the generators, $g_1$ to $g_4$ are operative in decade steps, it is necessary to know which generator $g_1$ to $g_4$ is operative, for example, by means of an indicator lamp (not shown) associated therewith, in order that the appropriate (mental) arithmetic adjustment (viz, decimel adjustment) may be made. The same calculation may be made if the switch position S2 indicates a decade factor is necessary to correct the pulse count displayed at the display D.

Figure 3:
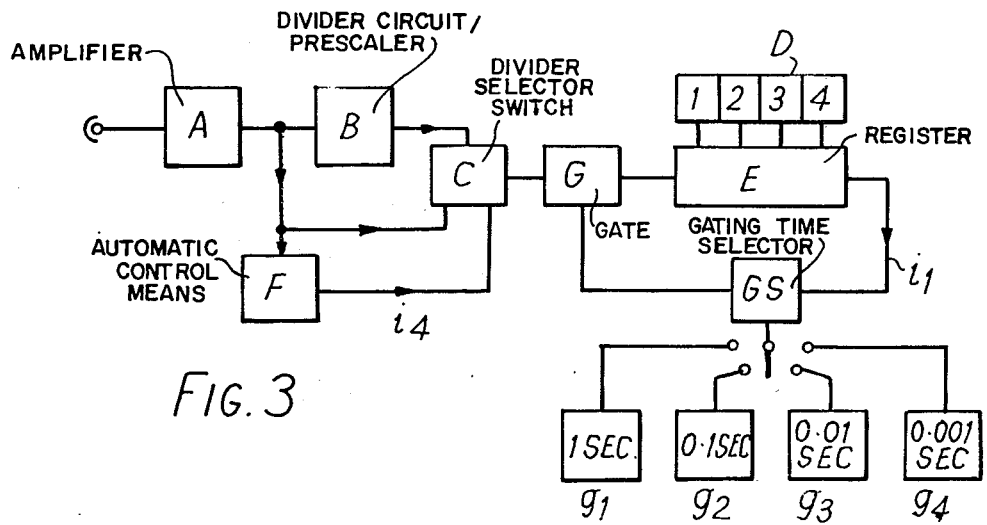
FIG. 3. illustrates schematically the counter of FIG. 2 which has the addition of means for automatically actuating the divider circuit.

In FIG. 3, automatic control means F are added to the counter 1 of FIG. 2. For the purpose of determining whether the divider circuit B is operative. The automatic means F comprises a frequency selector in an additional loop $i_4$ between the amplifier A and switch C. In addition, switch C is modified to be responsive to the output along loop $i_4$ to switch C.

Thus, as will be described, the switch C, regarded in the context of the FIG. 2 description, automatically switches from the S1 position to the S2 position on receipt of a signal from the frequency selector F.

The point at which the frequency selector becomes operative is fixed and corresponds to a decade step in the frequency range capability of the counter. By saying this, it is meant that if the counter has a range of $M.10^r$ as defined above, that the introduction of a divider gives a capability of $M.10^r$. D where D is the factor introduced by the divider circuit. If the divider circuit operates to divide the input pulse by a factor of ten (i.e., is a decade divider), then:

$$M.10^r . D = M.10^{r+1}$$

As abovementioned, M is the maximum number which display D may display and r is the number of decade stepped, gating time generators $g_1 \ldots g_r$. Since there may be more than one divider circuit, if these are d in number, the total capability will be $M.10^{(r+d)}$.

The further important parameter of the automatic control means F is whether this becomes operative after all the gating time generators $g_1$ to $g_r$ have become operative or whether there is flexibility such that the divider circuit D may be operative before the gating time selector GS reaches the end of the range $g_1$ to $g_n$, or in FIG. 3 $g_1$ to $g_4$.

At the highest end of the range of pulse frequencies within the capacity of this embodiment the generator $g_4$ is operative and the divider circuit B is operative. For a count within the intermediate range of the capability of the counter the frequency selector may be arranged to be operative when $I = M.10^{r+d-x}$, where x is some arbitrary value which causes the frequency selector to operate before x of the gating time generaors $g_1$ to $g_r$ are automatically rendered operative.

In the present embodiment, there are only four generators $g_1$ to $g_r$ and x may equal 2. This means that the control means F which comprises the frequency selector is tuned to an input frequency I of $9999.10^3$ or 9.999 MHz. Since $M = 9999$, $r = 4$, $d = 1$, $x = 2$ and all stages are decade stages. Thus, when the value of I is 9.999 MHz or more, the frequency selector passes a signal to the switch C which, in FIG. 2 terms, closes switch position S1 and renders the divider B operative. The frequency selector comprises a conventional high pass filter, alternatives to a high pass filter for the frequency selector will be readily apparent.

In FIG. 4 the counter of FIG. 3 is shown in greater detail and FIG. 5 shows an enlarged view of the divider and prescaler B. The prescaler B comprises a series of flip-flops $H_1$ to $H_4$ and an AND gate K. The arrangement of the flip-flops $H_1$ to $H_4$ and inputs to the AND gate K are such as to give an output frequency one tenth the input frequency.

We claim:

1. A high speed pulse counter comprising an input for a pulse signal to be counted,
   a counter register,
   a counter display responsive to the pulse count of the register,
   a gate for gating the input signal to be counted, the gate being arranged between the input and the register,
   a plurality of different gating time generators arranged to be coupled in sequence each having a discrete gating time,
   a gating time selector adapted for stepping between and coupling a selected one of the gating time generators to the gate, the register generating an overflow pulse in response to receipt of that one of the input pulses of the input signal to be counted succeeding the input pulse which causes the counter display to indicate a full register within the time period of a currently operative gating time itself determined by the operative position of the gating time selector, the gating time selector being coupled to the register to receive any such overflow pulse and being operative to be stepped thereby to the next gating time generator in said sequence, at least one divider circuit adapted to sub-divide the input signal to be counted and arrange for only a predetermined ratio of said input pulses to be counted by the register, and means for automatically actuating the divider circuit comprising an input for the pulse signal to be counted to automatic control means operative to control a divider circuit selector switch according to whether said pulse signal exceeds a predetermined frequency.

2. A high speed pulse counter comprising an input for a pulse signal to be counted, a counter register, a counter display responsive to the pulse count of the register, a gate for gating the input signal to be counted, the gate being arranged between the input and the register, a plurality of different gating time generators arranged to be coupled in sequence each having a discrete gating time, a gating time selector adapted for stepping between and coupling a selected one of the gating time generators to the gate, the register generating an overflow pulse in response to receipt of that one of the input pulses of the input signal to be counted succeeding the input pulse which causes the counter display to indicate a full register within the time period of a currently operative gating time itself determined by the operative position of the gating time selector, the gating time selector being coupled to the register to receive any such overflow pulse and being operative to be stepped thereby to the next gating time generator in said sequence, at least one divider circuit adapted to sub-divide the input signal to be counted and arrange for only a predetermined ratio of said input pulses to be counted by the register, and means for automatically actuating the divider circuit comprising an input for the pulse signal to be counted to a frequency selector of automatic control means operative to control a divider circuit selector switch according to whether said pulse signal exceeds a predetermined frequency.

3. A counter as defined in claim 2, wherein said frequency selector comprises a high pass filter.

* * * * *